(12) United States Patent
Singh et al.

(10) Patent No.: US 10,794,934 B2
(45) Date of Patent: Oct. 6, 2020

(54) INSTRUMENT TRANSFORMER FOR MEASURING AT LEAST ONE ELECTRICITY PROPERTY IN A CONDUCTOR OF A POWER GRID

(71) Applicant: ABB Schweiz AG, Baden (CH)

(72) Inventors: Bandeep Singh, Knightdale, NC (US); David Raschka, Greenville, NC (US); Steven A. Shaw, Greenville, NC (US); Vivek Siddharth, Greenville, NC (US); Jaroslaw Wojciech Chorzepa, Greenville, NC (US); Nirmal Paudel, Greenville, NC (US)

(73) Assignee: ABB Schweiz AG, Baden (CH)

( * ) Notice: Subject to any disclaimer, the term of this patent is extended or adjusted under 35 U.S.C. 154(b) by 73 days.

(21) Appl. No.: 16/237,528

(22) Filed: Dec. 31, 2018

(65) Prior Publication Data

US 2019/0204362 A1 Jul. 4, 2019

Related U.S. Application Data

(60) Provisional application No. 62/612,403, filed on Dec. 30, 2017.

(51) Int. Cl.
*G01R 15/18* (2006.01)
*H01R 33/90* (2006.01)
(Continued)

(52) U.S. Cl.
CPC ........... *G01R 15/18* (2013.01); *G01R 15/142* (2013.01); *G01R 21/06* (2013.01); *H01R 33/90* (2013.01);
(Continued)

(58) Field of Classification Search
CPC .... G01R 33/0047; G01R 33/02; G01R 21/06; G01R 15/142; G01R 15/183;
(Continued)

(56) References Cited

U.S. PATENT DOCUMENTS

| | | | | |
|---|---|---|---|---|
| 5,252,913 | A * | 10/1993 | Falkowski | G01R 15/142 174/140 R |
| 6,529,013 | B2 * | 3/2003 | Skendzic | G01R 15/06 324/607 |
| 6,888,086 | B2 * | 5/2005 | Daharsh | H01C 7/12 218/134 |

FOREIGN PATENT DOCUMENTS

| | | |
|---|---|---|
| CN | 203406160 U | 1/2014 |
| CN | 204832278 U | 12/2015 |
| WO | 2018/113954 A1 | 6/2018 |

* cited by examiner

*Primary Examiner* — Vinh P Nguyen
(74) *Attorney, Agent, or Firm* — Taft Stettinius & Hollister LLP; J. Bruce Schelkopf

(57) ABSTRACT

Instrument transformer for power grid conductor includes: a current sensing device having a secondary coil winding through which a power grid primary conductor is capable of extending and connecting to a primary conductor connector, a first low voltage (LV) lead connected to the secondary coil winding and a LV connector, and a first high voltage (HV) lead connected between the primary conductor connector and a HV connector, the voltage sensing device having a core with a primary coil winding, a second HV lead connected between a HV connector and primary coil winding, a grounding conductor connected between the primary coil winding and an output terminal, a second LV lead connected between a LV connector and output terminal, wherein the current and voltage sensing devices are electrically connected via HV and LV connectors, and wherein the current
(Continued)

and voltage sensing devices are separable when corresponding HV and LV connectors are disconnected.

5 Claims, 2 Drawing Sheets

(51) Int. Cl.
*G01R 21/06* (2006.01)
*G01R 15/14* (2006.01)
*H01R 13/62* (2006.01)
*H01R 13/53* (2006.01)

(52) U.S. Cl.
CPC ............ *G01R 15/181* (2013.01); *H01R 13/53* (2013.01); *H01R 13/62* (2013.01); *H01R 2201/20* (2013.01); *H01R 2201/22* (2013.01)

(58) Field of Classification Search
CPC .. G01R 15/185; G01R 19/00; G01R 19/0092; G01R 31/1236; G01R 31/50; G01R 31/52; G01R 33/0354; G01R 11/00; G01R 11/02; G01R 15/18; G01R 15/181; G01R 15/202; G01R 15/207; H01H 71/125; H01H 47/22; H01H 71/10; H01H 71/123; H01R 13/6683; H01R 13/7175; H01R 13/53; H01R 13/62; H01R 2201/20; H01R 2201/22; H01R 33/90
See application file for complete search history.

INSTRUMENT TRANSFORMER FOR MEASURING AT LEAST ONE ELECTRICITY PROPERTY IN A CONDUCTOR OF A POWER GRID

TECHNICAL FIELD

The present application relates generally to instrument transformers and more particularly, but not exclusively, to combined modular instrument transformers.

BACKGROUND

Instrument transformer systems remain an area of interest. Instrument transformers may be used for, for example, monitoring current and voltage in metering applications for utility revenue or other applications. Some existing systems have various shortcomings, drawbacks and disadvantages relative to certain applications. For example, in some instrument transformer configurations, if either of the current or voltage sensing units become inoperative, the entire system becomes inoperable. Accordingly, there remains a need for further contributions in this area of technology.

SUMMARY

One embodiment of the present invention is a unique instrument transformer. Other embodiments include apparatuses, systems, devices, hardware, methods, and combinations for instrument. Further embodiments, forms, features, aspects, benefits, and advantages of the present application shall become apparent from the description and figures provided herewith.

BRIEF DESCRIPTION OF THE FIGURES

The description herein makes reference to the accompanying drawings wherein like reference numerals refer to like parts throughout the several views, and wherein.

DETAILED DESCRIPTION OF THE ILLUSTRATIVE EMBODIMENTS

Figure 1:
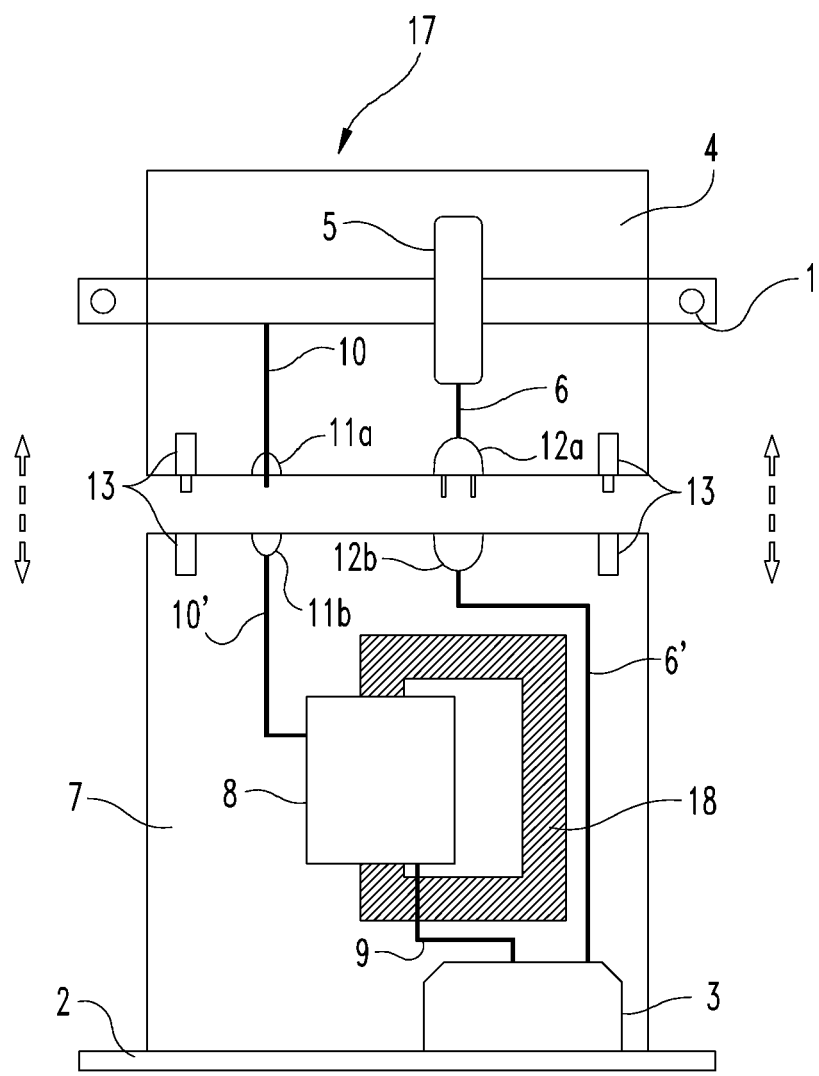
FIG. 1 schematically illustrates some aspects of a non-limiting example of a modular instrument transformer in accordance with an embodiment of the present invention.

For the purposes of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

Referring to FIG. 1, some aspects of a non-limiting example of a combined modular instrument transformer 17. Instrument transformer 17 includes a current sensing device 4 and a voltage sensing device 7. Instrument transformer 17 is modular, at least insofar as in some embodiments, current sensing device 4 and voltage sensing device 7 are constructed and capable of electrical and mechanical connection to each other, wherein the electrical connections are constructed for "plug-in" connectivity, and may be "unplugged" for disconnection or separation in a modular fashion. For example, as part of the modular construction, in some embodiments, the electrical connections themselves may be made or broken without the use of tools. Rather, electrical connections may be made and subsequently broken by mechanically connecting or mounting or joining current sensing device 4 to voltage sensing device 7 or vice versa. Mechanically mounting, connecting or joining current sensing device 4 to voltage sensing device 7 results in the electrical connections being plugged in and made, in a similar manner to how home appliances are plugged in to a home electrical outlet, and during mechanical dismounting or disconnection, the electrical connections are unplugged and broken in a similar manner to how home appliances may be unplugged from a home electrical outlet. Current sensing device 4 and voltage sensing device 7 are each a module or modular component of instrument transformer 17. The modularity of instrument transformer 17 allows the simple replacement of a single component (e.g., current sensing device 4 or voltage sensing device 7) upon failure of that component, rather than the replacement of the entire instrument transformer 17. In some embodiments, the replacement may be made without the use of tools to make or break electrical connections between current sensing device 4 and voltage sensing device 7, and in some embodiments, without the use of tools to make or break mechanical connections between current sensing device 4 and voltage sensing device 7.

The current sensing device 4 of the instrument transformer 17 of FIG. 1 includes a secondary coil winding 5, a first low voltage lead 6, a first high voltage lead 10, a high voltage connector 11a and a low voltage connector 12a. Conductor 1, such as a primary conductor 1 of the electrical system being monitored, extends through secondary coil winding 5. Conductor 1 may be, for example, a single phase of a three phase electrical system, power supply or grid. In such embodiments, an instrument transformer 17 with a current sensing device 4 and voltage sensing device 7 may be used for each phase, whereas in other embodiments, instrument transformer 17 may include a current sensing device 4 and voltage sensing device 7 for each phase. The first low voltage lead 6 is connected between the secondary coil winding 5 and the low voltage connector 12a. The first high voltage lead 10 is connected between the primary conductor 1 and the high voltage connector 11a.

The voltage sensing device 7 of the instrument transformer 17 of FIG. 1 includes a mounting plate 2, an output terminal 3, a second low voltage lead 6', a primary coil 8, a grounding conductor 9, a second high voltage lead 10', a high voltage connector 11b, a low voltage connector 12b and a core 18. Primary coil 8 is wound around core 18. Second high voltage lead 10' is connected between the high voltage connector 11b and the primary coil winding 8. The second low voltage lead 6' connects the low voltage connector 12b to the output terminal 3. Grounding conductor 9 connects the primary coil winding 8 to the output terminal 3, and the mounting plate 2 in contact with the base of the voltage sensing device 7.

In some embodiments, the high and low voltage electrical connectors 11a, 11b, 12a, 12b are constructed as plug-in electrical connectors, such as those described above. The high and low voltage electrical connectors 11a, 11b, 12a, 12b are corresponding male and female connectors that mate when the high and low voltage sensing devices 4, 7 are connected or mounted or joined together. In some embodiments, the high voltage connectors 12a, 12b are shielded electrical connectors in order to prevent corona discharge.

In some embodiments, the current sensing device 4 and voltage sensing device 7 are each separately and individually encapsulated in a resin, which may be, for example, a hydrophobic cycloaliphatic epoxy (HCEP) resin. The encapsulation may be through an automatic pressure gelation process, which is well known. In other embodiments, the encapsulation may also or alternatively be achieved by potting the current and voltage sensing devices 4, 7, e.g., in or using a polymeric material. In still other embodiments, other schemes for encapsulation by resins and/or other suitable materials may be employed. It will be understood that, in yet other embodiments, other resins, encapsulation material(s), and/or one or more housings may be used with the instrument transformer 17, e.g., to house or encapsulate current sensing device 4 and/or voltage sensing device 7, depending on the application.

The current sensing device 4 and the voltage sensing device 7 are electrically connected together to form the instrument transformer 17 when the corresponding high voltage connectors 11a, 11b are connected together and the corresponding low voltage connectors 12a, 12b are connected together. The current sensing device 4 and the voltage sensing device 7 are electrically disconnected from each other and separated when the corresponding high and low voltage connectors 11a, 11b, 12a, 12b are separated from each other.

In various embodiments, the current and voltage sensing devices 4, 7 are mechanically connected together using fasteners 13, an adhesive, and/or a sealing material. Fasteners 13 may be any type of suitable fasteners, including threaded fasteners. Some embodiments may use dowel pins, bosses, protrusions and/or other locating features that locate or position current sensing device 4 and voltage sensing device 7 relative to each other, and in some embodiments to align high voltage connectors 11a, 11b with each other, and to align low voltage connectors 12a, 12b with each other. In some embodiments, current sensing device 4 and voltage sensing device 7 may be located or positioned relative to each other by fasteners 13 or by using other locating or positioning schemes. It should be understood that the mechanical and electrical connections for each of the low and high voltage sides of the instrument transformer 17 may be combined into single electromechanical connections. When the current and voltage sensing devices 4, 7 are connected together and the instrument transformer 17 is used for an outdoor application, the ends 23, 24 (see, e.g., FIG. 2) of the current and voltage sensing devices 4, 7 are provided with a circumferentially-extending lip (not shown) to seal the unit from ingress of moisture, dust and other environmental elements, e.g., from between current and voltage sensing devices 4, 7.

In some embodiments that employ fasteners 13 to connect the current and voltage sensing devices 4, 7 together, inserts 25, 26 (see, e.g., FIG. 2) are provided for accepting the fasteners 13. Fasteners 13 and inserts 25, 26 are constructed to mechanically connect or mount or join the current and voltage sensing devices 4, 7 together to form the combined, modular instrument transformer 17, and to secure or releasably secure the current and voltage sensing devices 4, 7 together. Alternatively, the fasteners 13 may be self-locking rivets that connect the current and voltage sensing devices 4, 7 together. In some such embodiments, such fasteners 13 may be installed after current and voltage sensing devices 4, 7 are pushed together and the high and low voltage connectors 11a, 11b, 12a, 12b are connected. Such fasteners may be removed before the high and low voltage connectors 11a, 11b, 12a, 12b are disconnected, and the current and voltage sensing devices 4, 7 may then be separated from each other.

The modularity of the instrument transformer 17 also allows for swapping out one of the voltage and current sensing devices 4, 7, e.g., to change the ratios in response to a changed specification or a change in conditions of power supplied through primary conductor 1. For example, an instrument transformer 17 may be separated into the current and voltage sensing devices 4, 7 to allow replacement by one or both of a different current and voltage sensing device 4, 7. By way of a non-limiting example, the system may be provided with a 25 kV voltage sensing device 7 and an existing current sensing device 4 to form an instrument transformer 17. Further, by way of a non-limiting example, an originally connected current sensing device 4 may be disconnected from the voltage sensing device 7 and a 15 KV current sensing device 4 may be connected thereto for handling an increased and/or changing requirement such as withstanding voltage spikes and providing an increased basic insulation level (BIL) rating. Such a swap may allow the power grid or instrument transformer 17 monitoring the power grid to be protected or provide measurements in a more robust fashion.

While some potential installations of a single current sensing device and a single voltage sensing device per phase may allow for ease of replacement on the corresponding cable(s) and/or conductor(s), e.g., in a three-phase system, for monitoring, disconnecting and switching, in such schemes, there is a large footprint due to the separate mounting plates required to individually mount each single current sensing device and each single voltage sensing device, e.g., singly. Additionally, combined current and voltage sensing devices may potentially be employed, however, such devices would be wholly encapsulated, so that when one of the current and voltage sensing devices fails, the other is rendered useless, and the entire instrument transformer must be replaced, thus effectively throwing away the sensing device that did not fail, or requiring a potentially expensive repair of the instrument transformer.

As described, the present disclosure provides the instrument transformer 17 having current and voltage sensing devices 4, 7 that can be readily combined or separated in modular fashion for installation, repair or replacement of either or both of the current and voltage sensing devices 4, 7, e.g., without tools for making or breaking electrical connections in some embodiments. The instrument transformer 17 may be provided as one instrument transformer 17 per phase or as a single unit capable of three-phase voltage and current sensing. Line-to-ground and/or line-to-line voltage may be measured using the instrument transformer 17 described herein.

Figure 2:
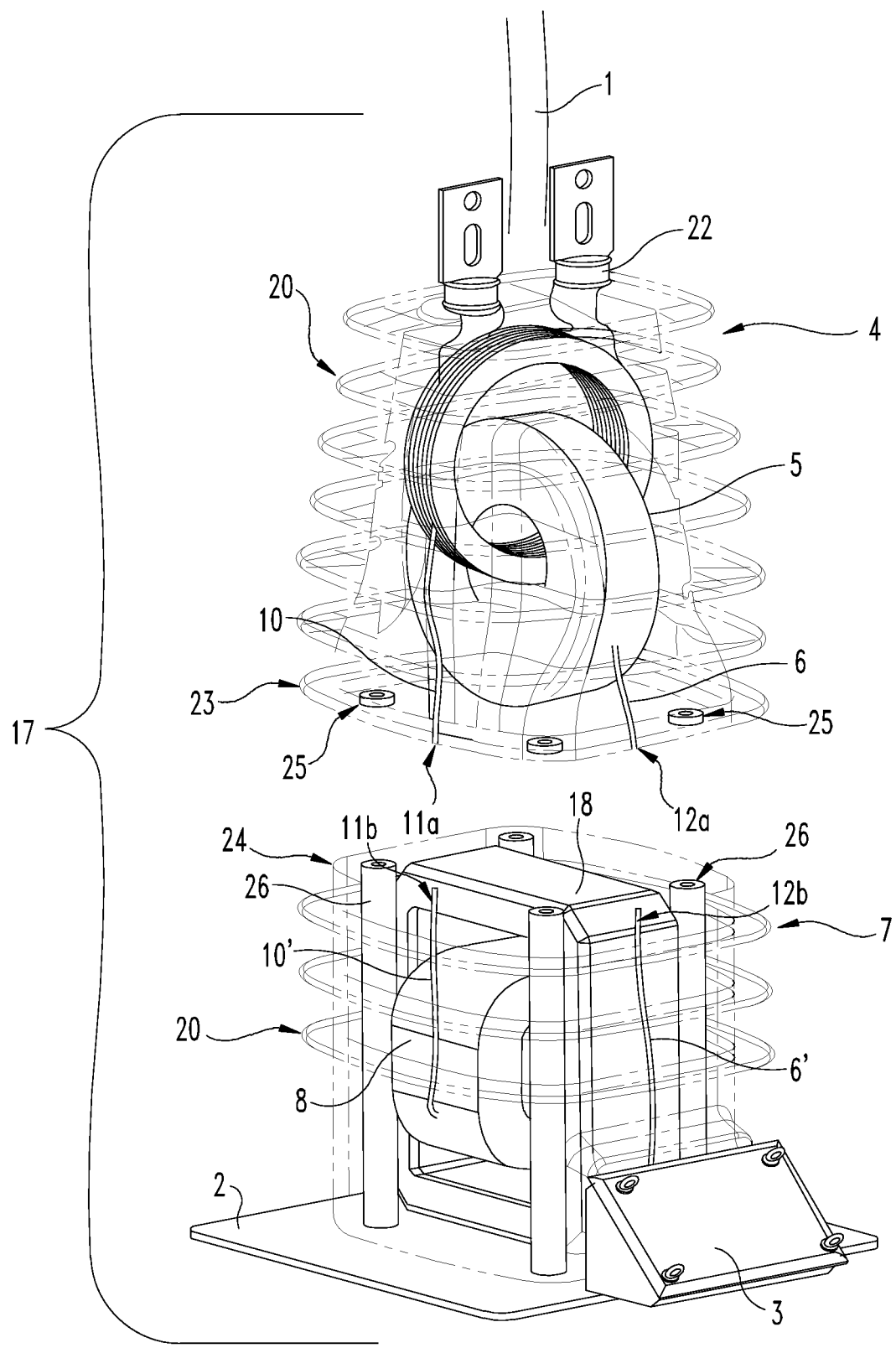
FIG. 2 schematically illustrates a sectional view of some aspects of a non-limiting example of a modular instrument transformer in accordance with an embodiment of the present invention.

With reference to FIG. 2, some aspects of a non-limiting example of an embodiment is shown in which a primary conductor connector 22 passes through the secondary winding 5 of the current sensing component 4 instead of the primary conductor 1 directly passing through the secondary coil winding 5. The primary conductor connector 22 is connected to the elongated primary conductor 1 and/or part of the primary conductor 1 is wound around a circular portion of the primary conductor connector 22. In one embodiment, the primary conductor connector 22 is a banana clip connector. In other embodiments, other types of primary conductor connectors may be employed. The balance of the instrument transformer 17 construction is the same as was previously described with reference to FIG. 1. In one embodiment, circumferentially-extending sheds 20 are provided along the length of the instrument transformer 17. The sheds 20 may be provided of HCEP or another material, e.g., depending upon the application.

Embodiments of the present invention include an instrument transformer for measuring at least one property of electricity in a conductor of a power grid, comprising: the current sensing device having a secondary coil winding through which a primary conductor of the power grid is capable of extending and connecting to a primary conductor connector, a first low voltage lead connected to the secondary coil winding and a low voltage connector, and a first high voltage lead connected between the primary conductor connector and a high voltage connector, the current sensing device being encapsulated in a resin; the voltage sensing device having a core with a primary coil winding wound thereupon, a second high voltage lead connected between a high voltage connector and the primary coil winding, a grounding conductor connected between the primary coil winding and an output terminal, a second low voltage lead connected between a low voltage connector and the output terminal, the voltage sensing device being encapsulated in a resin; and a mounting plate for connection with a base of the voltage sensing device, wherein the current and voltage sensing devices are electrically connected to form the instrument transformer when the corresponding high voltage connectors and low voltage connectors are connected together and wherein the current and voltage sensing devices are separable when the corresponding high voltage and low voltage connectors are disconnected.

In a refinement, each of the current and voltage sensing devices are capable of mechanical connection together, using a member selected from the group consisting of: a fastener, an adhesive and a sealing material.

In another refinement, when the voltage and current sensing devices are separated, one the voltage and current sensing devices can be replaced with a different one of the voltage and current sensing device to form the instrument transformer.

In yet another refinement, when one of the voltage and current sensing devices are replaced with a different one of the voltage and current sensing devices a different requirement for measuring the power grid can be achieved.

In yet another refinement, when one of the voltage and current sensing devices are replaced with a different one of the voltage and current sensing devices an increased requirement for protecting the power grid can be achieved.

To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995). Also, to the extent that the terms "in" or "into" are used in the specification or the claims, it is intended to additionally mean "on" or "onto." Furthermore, to the extent the term "connect" is used in the specification or claims, it is intended to mean not only "directly connected to," but also "indirectly connected to" such as connected through another component or components.

While the invention has been illustrated and described in detail in the drawings and foregoing description, the same is to be considered as illustrative and not restrictive in character, it being understood that only the preferred embodiments have been shown and described and that all changes and modifications that come within the spirit of the inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

What is claimed is:

1. An instrument transformer for measuring at least one property of electricity in a conductor of a power grid, comprising:
   a current sensing device having a secondary coil winding through which a primary conductor of the power grid is capable of extending and connecting to a primary conductor connector, a first low voltage lead connected to the secondary coil winding and a low voltage connector, and a first high voltage lead connected between the primary conductor connector and a high voltage connector, the current sensing device being encapsulated in a resin;
   a voltage sensing device having a core with a primary coil winding wound thereupon, a second high voltage lead connected between a high voltage connector and the primary coil winding, a grounding conductor connected between the primary coil winding and an output terminal, a second low voltage lead connected between a low voltage connector and the output terminal, the voltage sensing device being encapsulated in a resin; and
   wherein the current and voltage sensing devices are electrically connected to form the instrument transformer when the corresponding high voltage connectors and low voltage connectors are connected together and wherein the current and voltage sensing devices are separable when the corresponding high voltage and low voltage connectors are disconnected.

2. The instrument transformer of claim 1 wherein each of the current and voltage sensing devices are capable of mechanical connection together, using a member selected from the group consisting of: a fastener, an adhesive and a sealing material.

3. The instrument transformer of claim 1 wherein when the voltage and current sensing devices are separated, one the voltage and current sensing devices can be replaced with a different one of the voltage and current sensing device to form the instrument transformer.

4. The instrument transformer of claim 3 wherein when one of the voltage and current sensing devices are replaced with a different one of the voltage and current sensing devices a different requirement for measuring the power grid can be achieved.

5. The instrument transformer of claim 3 wherein when one of the voltage and current sensing devices are replaced with a different one of the voltage and current sensing devices an increased requirement for protecting the power grid can be achieved.

* * * * *